(12) United States Patent
Ikeda et al.

(10) Patent No.: US 8,187,917 B2
(45) Date of Patent: May 29, 2012

(54) METHOD FOR MANUFACTURING MEMORY DEVICE

(75) Inventors: Hisao Ikeda, Kanagawa (JP); Takahiro Ibe, Kanagawa (JP); Junichi Koezuka, Kanagawa (JP); Kaoru Kato, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/008,148

(22) Filed: Jan. 18, 2011

(65) Prior Publication Data
US 2011/0111554 A1  May 12, 2011

Related U.S. Application Data

(62) Division of application No. 12/054,914, filed on Mar. 25, 2008, now Pat. No. 7,875,881.

(30) Foreign Application Priority Data

Apr. 3, 2007  (JP) ................................ 2007-096977

(51) Int. Cl.
*H01L 29/08* (2006.01)
(52) U.S. Cl. ....... 438/99; 257/68; 257/88; 257/E21.645; 257/E51.028; 257/40; 428/690; 428/917; 428/212; 313/504; 313/506
(58) Field of Classification Search .................... 257/38, 257/40, E21.645, E51.028; 438/99
See application file for complete search history.

(56) References Cited

U.S. PATENT DOCUMENTS

| | | |
|---|---|---|
| 5,236,850 A | 8/1993 | Zhang |
| 5,254,208 A | 10/1993 | Zhang |
| 5,374,564 A | 12/1994 | Bruel |
| 5,492,843 A | 2/1996 | Adachi et al. |
| 5,656,516 A | 8/1997 | Suzuki |
| 5,766,989 A | 6/1998 | Maegawa et al. |
| 5,837,619 A | 11/1998 | Adachi et al. |
| 5,876,497 A | 3/1999 | Atoji |
| 5,989,737 A | 11/1999 | Xie et al. |
| 6,008,076 A | 12/1999 | Codama et al. |
| 6,013,384 A | 1/2000 | Kido et al. |
| 6,103,009 A | 8/2000 | Atoji |
| 6,127,702 A | 10/2000 | Yamazaki et al. |
| 6,191,007 B1 | 2/2001 | Matsui et al. |

(Continued)

FOREIGN PATENT DOCUMENTS

JP    02-054532    2/1990

(Continued)

*Primary Examiner* — Jami M Valentine
(74) *Attorney, Agent, or Firm* — Nixon Peabody LLP; Jeffrey L. Costellia

(57) ABSTRACT

Objects are to solve inhibition of miniaturization of a memory element and complexity of a manufacturing process thereof, and to provide a nonvolatile memory device and a semiconductor device each having the memory device, in which data can be additionally written except at the time of manufacture and in which forgery or the like caused by rewriting of data can be prevented, and a memory device and a semiconductor device that are inexpensive and nonvolatile. The present invention provides a semiconductor device that includes a plurality of memory elements, in each of which a first conductive layer, a second conductive layer disposed beside the first conductive layer, and a mixed film that are disposed over the same insulating film. The mixed film contains an inorganic compound, an organic compound, and a halogen atom and is disposed between the first conductive layer and the second conductive layer.

18 Claims, 9 Drawing Sheets

U.S. PATENT DOCUMENTS

| | | | |
|---|---|---|---|
| 6,251,754 B1 | 6/2001 | Ohshima et al. |
| 6,271,101 B1 | 8/2001 | Fukunaga et al. |
| 6,335,231 B1 | 1/2002 | Yamazaki et al. |
| 6,372,609 B1 | 4/2002 | Aga et al. |
| 6,380,046 B1 | 4/2002 | Yamazaki |
| 6,388,652 B1 | 5/2002 | Yamazaki et al. |
| 6,423,429 B2 | 7/2002 | Kido et al. |
| 6,479,334 B1 | 11/2002 | Codama et al. |
| 6,486,601 B1 | 11/2002 | Sakai et al. |
| 6,534,380 B1 | 3/2003 | Yamauchi et al. |
| 6,589,673 B1 | 7/2003 | Kido et al. |
| 6,602,761 B2 | 8/2003 | Fukunaga |
| 6,620,528 B1 | 9/2003 | Yamazaki et al. |
| 6,686,623 B2 | 2/2004 | Yamazaki |
| 6,778,164 B2 | 8/2004 | Yamazaki et al. |
| 6,803,264 B2 | 10/2004 | Yamazaki et al. |
| 6,849,872 B1 | 2/2005 | Yamazaki et al. |
| 6,875,633 B2 | 4/2005 | Fukunaga |
| 6,908,797 B2 | 6/2005 | Takano |
| 6,947,321 B2 | 9/2005 | Tanabe |
| 7,119,365 B2 | 10/2006 | Takafuji et al. |
| 7,158,161 B2 | 1/2007 | Gyoutoku et al. |
| 7,176,525 B2 | 2/2007 | Fukunaga |
| 7,199,024 B2 | 4/2007 | Yamazaki |
| 7,256,776 B2 | 8/2007 | Yamazaki et al. |
| 7,499,305 B2 | 3/2009 | Nomura et al. |
| 2001/0019877 A1 | 9/2001 | Miyake et al. |
| 2002/0070454 A1 | 6/2002 | Yasukawa |
| 2003/0111666 A1 | 6/2003 | Nishi et al. |
| 2003/0183699 A1 | 10/2003 | Masui |
| 2003/0189401 A1 | 10/2003 | Kido et al. |
| 2004/0061176 A1 | 4/2004 | Takafuji et al. |
| 2004/0104424 A1 | 6/2004 | Yamazaki |
| 2004/0161192 A1 | 8/2004 | Hamano et al. |
| 2004/0164302 A1 | 8/2004 | Arai et al. |
| 2005/0006640 A1 | 1/2005 | Jackson et al. |
| 2005/0009252 A1 | 1/2005 | Yamazaki et al. |
| 2005/0084712 A1* | 4/2005 | Kido et al. ............... 428/690 |
| 2005/0084713 A1 | 4/2005 | Kido et al. |
| 2005/0098207 A1 | 5/2005 | Matsumoto et al. |
| 2005/0106419 A1* | 5/2005 | Endoh et al. ............... 428/690 |
| 2005/0170208 A1 | 8/2005 | Yatsunami et al. |
| 2005/0260800 A1 | 11/2005 | Takano |
| 2006/0008740 A1 | 1/2006 | Kido et al. |
| 2006/0157691 A1 | 7/2006 | Lee et al. |
| 2006/0263634 A1 | 11/2006 | Yamazaki |
| 2006/0292394 A1 | 12/2006 | Iwaki et al. |
| 2007/0042221 A1 | 2/2007 | Kawamura |
| 2007/0063281 A1 | 3/2007 | Takafuji et al. |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0200125 A1 | 8/2007 | Ikeda et al. |
| 2007/0254432 A1 | 11/2007 | Yamazaki et al. |
| 2007/0281440 A1 | 12/2007 | Cites et al. |
| 2007/0291022 A1 | 12/2007 | Yamazaki et al. |
| 2008/0246109 A1 | 10/2008 | Ohnuma et al. |
| 2008/0268263 A1 | 10/2008 | Yamazaki |
| 2008/0268618 A1 | 10/2008 | Yamazaki |
| 2008/0308794 A1 | 12/2008 | Ibe et al. |
| 2009/0001879 A1 | 1/2009 | Ikeda et al. |
| 2009/0001886 A1 | 1/2009 | Ibe et al. |

FOREIGN PATENT DOCUMENTS

| | | |
|---|---|---|
| JP | 03-274695 | 12/1991 |
| JP | 09-063771 | 3/1997 |
| JP | 11-163363 | 6/1999 |
| JP | 11-307259 | 11/1999 |
| JP | 11-307264 | 11/1999 |
| JP | 2000-223276 | 8/2000 |
| JP | 2000-315580 | 11/2000 |
| JP | 2000-315581 | 11/2000 |
| JP | 2000-367784 | 12/2002 |
| JP | 2002-367784 | 12/2002 |
| JP | 2005-019074 | 1/2005 |
| JP | 2005-026121 | 1/2005 |
| JP | 2005-032618 | 2/2005 |

* cited by examiner

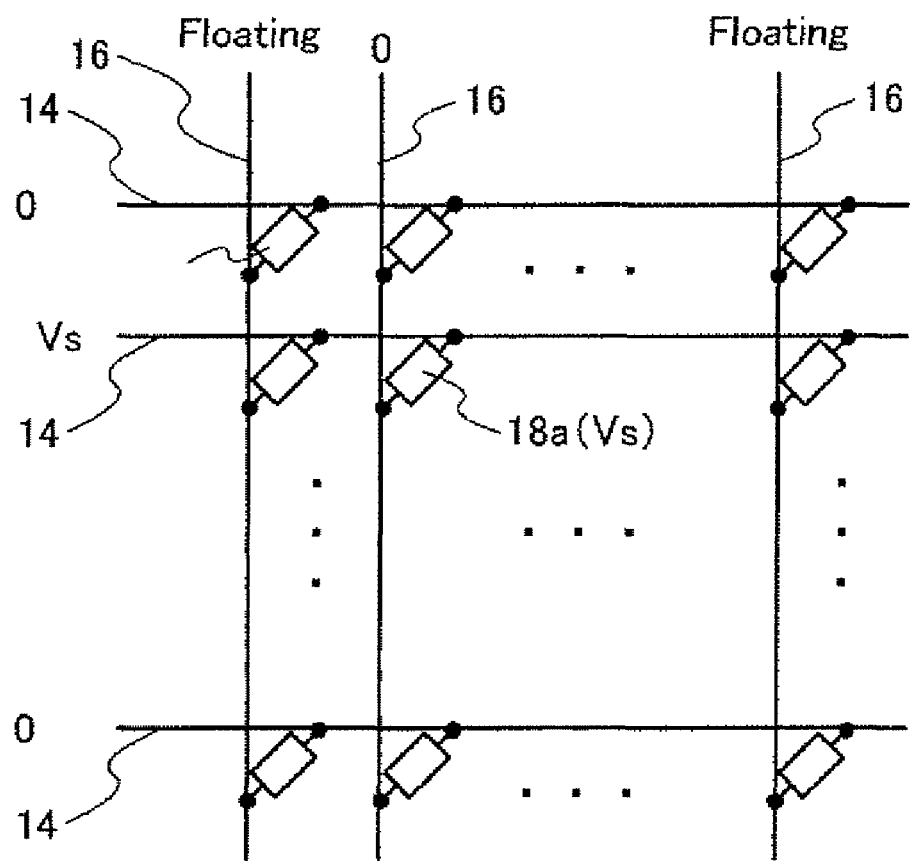

METHOD FOR MANUFACTURING MEMORY DEVICE

BACKGROUND OF THE INVENTION

1. Field of the Invention

The present invention relates to memory devices and semiconductor devices each having circuits that include memory elements and to a method for manufacturing the memory devices.

A semiconductor device in this specification refers to all types of devices which can function by use of semiconductor characteristics, such as electro-optic devices, semiconductor circuits, and electronic devices.

2. Description of the Related Art

As described in Reference 1 (United States Patent Application Publication No. 2005-0006640), a memory element that uses an organic compound typically has a structure in which two electrodes as two terminals of the memory element are provided above and below an organic compound layer.

SUMMARY OF THE INVENTION

Examples of memory circuits provided in semiconductor devices include dynamic random access memories (DRAMs), static random access memories (SRAMs), ferroelectric random access memories (FeRAMs), mask read only memories (mask ROMs), electrically programmable read only memories (EPROMs), electrically erasable and programmable read only memories (EEPROMs), flash memories, and the like. These memory circuits have the following problems. As regards DRAMs and SRAMs that are volatile memory circuits, in which data are erased when power is turned off, it is necessary to write data every time the power is turned on. As regards FeRAMs, although they are nonvolatile memory circuits, the number of manufacturing steps thereof is increased because capacitors each including a ferroelectric layer are used therein. As regards mask ROMs, although they each have a simple structure, it is necessary to write data during manufacturing steps thereof, and data cannot be additionally written. As regards EPROMs, EEPROMs, and flash memories, although they are nonvolatile memory circuits, the number of manufacturing steps thereof is increased because elements each having two gate electrodes are used therein.

In a typical memory circuit using an organic compound, the organic compound is provided between a pair of upper and lower electrodes to form a memory element. When the electrode is formed over an organic layer, the organic layer is affected depending on the formation temperature of the electrode, and thus there is the limitation on the formation temperature. Because of this limitation of the temperature, there is the limitation on a formation method of an electrode, and a desired electrode cannot be formed. This creates a problem in that miniaturization of an element is inhibited. A problem related to an electrode formed over an organic layer is needed to be solved in terms of inhibition of the element miniaturization.

Furthermore, in the case of the memory element described in Reference 1 in which a pair of electrodes as two terminals is formed above and below an organic layer, the plurality of steps are needed to form the pair of electrodes because the electrodes are each provided above and below the organic layer. Unfortunately, this makes a manufacturing process complicated. The complicated manufacturing process is a problem that is needed to be solved in terms of manufacturing cost.

In the case where memory elements are considered to be mounted in portable information terminals or small pieces such as chips, it is preferable to perform writing and reading data to/from the memory element with limited power. It is an object to reduce power consumption that is needed for writing and reading data to/from the memory element.

In view of the foregoing problems, it is an object of the present invention to solve the inhibition of miniaturization of memory elements and complexity of a manufacturing process. It is another object to provide a nonvolatile memory device in which data can be additionally written except at the time of manufacture and in which forgery or the like caused by rewriting of data can be prevented, and a semiconductor device having the nonvolatile memory device. It is further another object to provide an inexpensive nonvolatile memory device and a semiconductor device having the nonvolatile memory device.

In view of the above objects, one aspect of the present invention is a memory element in which a first conductive layer, a second conductive layer disposed beside the first conductive layer, and a mixed film of an inorganic compound, an organic compound, and a halogen atom are disposed over the same insulating film. The mixed film is disposed between the first conductive layer and the second conductive layer. The present invention solves at least one of the above objects.

Specific examples of the inorganic compound include molybdenum oxide, vanadium oxide, ruthenium oxide, tungsten oxide, and the like. Alternatively, indium oxide, zinc oxide, or tin oxide can be used. However, there is no limitation to the substances described here, and any other substance may be used.

A hole-transporting material is suitable for use as the organic compound. Examples of such material includes aromatic amine compounds such as 4,4'-bis[N-(1-naphthyl)-N-phenylamino]biphenyl (NPB), 4,4'-bis[N-(3-methylphenyl)-N-phenylamino]biphenyl (TPD), 4,4',4''-tris(N,N-diphenylamino)triphenylamine (TDATA), 4,4'-bis(N-{4-[N'-(3-methylphenyl)-N'-phenylamino]phenyl}-N-phenylamino)biphenyl (DNTPD), and the like. Alternatively, an anthracene derivative such as 9,10-di(phenyl)anthracene can be used. However, there is no limitation to the substances described here, and any other substance may be used.

Fluorine or chlorine is suitable for use as the halogen atom. However, there is no limitation to the substances described here, and any other substance may be used.

The inorganic compound and the organic compound are mixed to form a charge-transfer complex, in which the carrier density is increased, and accordingly, the conductivity is improved. The conductivity value is extremely higher than that of an organic semiconductor film.

By addition of the halogen atom to the mixture of the inorganic compound and the organic compound, the conductivity is significantly increased; and, the mixed film is characterized in that it can be separated easily from the substrate.

When writing is performed to the memory element with the use of a wireless signal, a semiconductor device of the present invention includes an antenna and a power supply generating circuit in addition to the above structure.

In the above structure, a voltage is applied between the two terminals in the memory element to pass current through the mixed film, the mixed film is separated from the substrate, and the resistance value between the electrodes is significantly increased, whereby writing is performed to the memory element. Since the first conductive layer and the second conductive layer are formed over the same insulating film, a voltage is applied in a direction parallel to a plane of the insulating film.

By addition of the halogen atom, adhesion of each of the substrate and the mixed film is reduced, whereby they are separated at a low applied voltage.

A distance between electrodes of the first conductive layer and the second conductive layer provided on the same plane of the insulating film can be several nm to several hundreds nm depending on processing precision of formation of the electrodes. For example, when the distance between the electrodes is 35 nm or more, the first conductive layer and the second conductive layer may be formed in such a manner that a resist is exposed by EB exposure to form a mask and a conductive film is selectively etched.

Side surfaces of the first conductive layer and the second conductive layer may be each formed to have a tapered shape. Another aspect disclosed in this specification is a memory device that includes a first conductive layer and a second conductive layer on the same insulating plane and a mixed film between the first conductive layer and the second conductive layer. The side surfaces of the first conductive layer and the second conductive layer each have an angle of less than 90° with respect to the insulating plane. When the side surfaces each have a tapered shape, a region between two side surfaces which face each other is enlarged, and many mixed films can be disposed in the region.

An aspect of the present invention for achieving the above structure is a method for manufacturing a memory device. In the memory device, a first conductive layer and a second conductive layer that are disposed with an electrode distance "d" therebetween are formed over an insulating surface, and a mixed film is formed between a side surface of the first conductive layer and a side surface of a second conductive layer which faces the side surface of the first conductive layer.

When the first conductive layer and the second conductive layer are formed with high alignment accuracy and a small electrode distance "d", the first conductive layer and the second conductive layer are preferably formed in such a manner that a conductive film is formed over an insulating surface, a mask is formed over the conductive film, and the conductive film is selectively etched using the mask.

When the electrode distance "d" is several nm, it is preferable that resist masks be formed by a nanoimprint method to form the first conductive layer and the second conductive layer. Further, the pair of electrodes may be formed in such a manner that one wiring is partially removed using laser light irradiation and then cut or separated.

Furthermore, the first conductive layer and the second conductive layer may be formed by any of an inkjet method, a dispensing method, or the like, which are wet processes.

Furthermore, in the formation method of the mixed film, after the inorganic compound and the organic compound are formed by a co-evaporation method, the halogen atom is added to the mixed film preferably by an ion implantation method.

Furthermore, the mixed film may be formed by any of an inkjet method, a dispensing method, or the like, which are wet processes.

In accordance with the present invention, a manufacturing process of a memory element can be simplified. Thus, a memory device with reduced manufacturing cost can be provided.

Further, the present invention provides a nonvolatile memory device and a semiconductor device that includes the nonvolatile memory device, in which data can be additionally written except at the time of manufacture and in which forgery or the like caused by rewriting can be prevented. Furthermore, the present invention provides an inexpensive memory device and a semiconductor device that includes the memory device.

BRIEF DESCRIPTION OF THE DRAWINGS

In the accompanying drawings:

FIG. 5 is a diagram of a reading circuit included in a memory device of the present invention;

DETAILED DESCRIPTION OF THE INVENTION

Embodiment modes of the present invention are described below.

Embodiment Mode 1

Figure 1A:
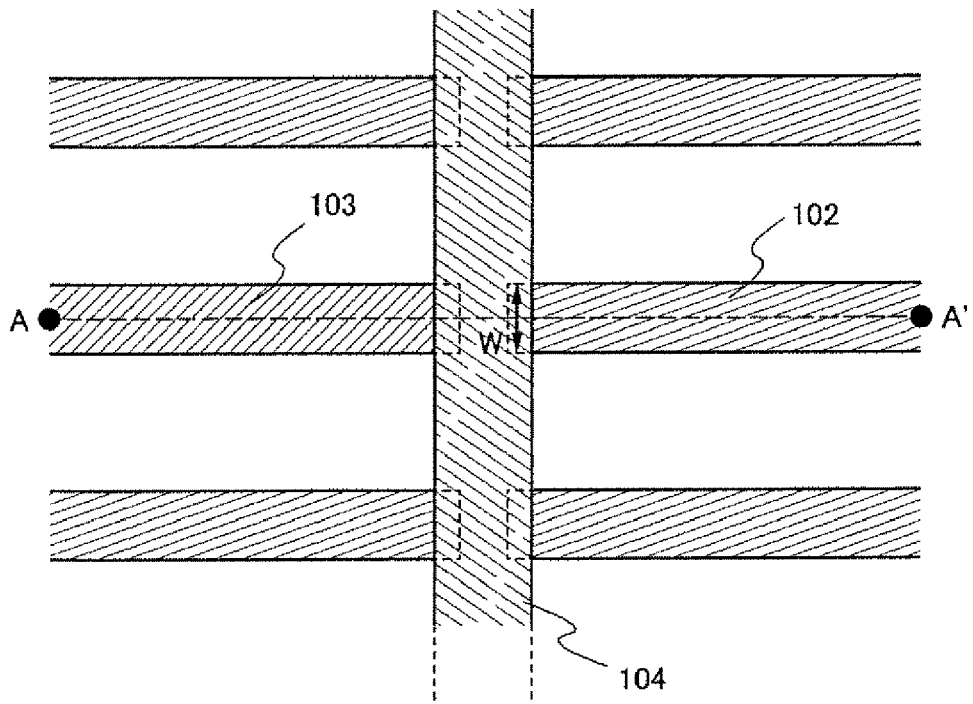
FIG. 1A is a top view of a memory device of the present invention.
Figure 1B:
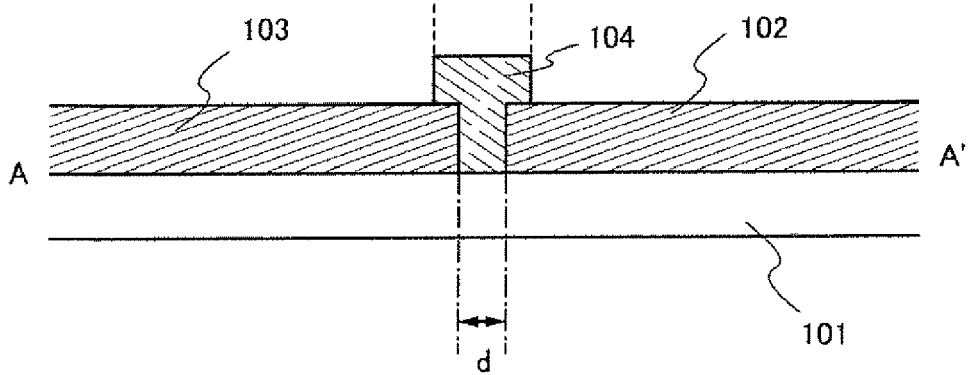
FIG. 1B is a cross-sectional view thereof.

In this embodiment mode, an example of a semiconductor device is described. FIG. 1A is a top view, and FIG. 1B is a cross-sectional view taken along a line A-A' of FIG. A.

In FIG. 1A, three memory elements are shown. Although an example of three memory elements is given here to make description simple, there is no limitation on the number of memory elements, and designers of semiconductor devices may set the number of memory elements, which corresponds to the desired bit number. For example, memory elements may be formed so as to correspond to 8 bits, 16 bits, 32 bits, 64 bits, and the like. As shown in FIG. 1B, over a substrate 101 having an insulating surface, the memory element includes a first conductive layer 102, a second conductive layer 103, and a mixed film 104 disposed therebetween.

The mixed film 104 has a larger width than an electrode distance "d" and partially overlaps the first conductive layer 102 and the second conductive layer 103. Further, the shape of a top surface of the mixed film 104 is not limited to that shown in FIG. 1A. The mixed film is disposed at least between side surfaces of the first conductive layer 102 and the second conductive layer 103 which face each other.

The mixed film 104 has a pattern shape extending over the three memory elements. Each distance between the adjacent memory elements is preferably wider than the electrode distance "d". Although the mixed film 104 is extending over the three memory elements, three mixed films 104 may be separately provided for each memory element.

The mixed film includes an inorganic compound, an organic compound, and a halogen atom. For the inorganic compound used in the mixed film, inorganic oxide can be used. Specifically, transition metal oxide can be used. Alternatively, oxide of metals that belong to Group 4 to Group 8 of the periodic table can be used. Specifically, vanadium oxide, niobium oxide, tantalum oxide, chromium oxide, molybdenum oxide, tungsten oxide, manganese oxide, or rhenium oxide is preferably used because of their high electron accepting properties. Alternatively, indium oxide, zinc oxide, or tin oxide can be used. In the case where the mixed film is formed by an evaporation method, use of molybdenum oxide is particularly preferable because of its stability in the atmosphere, a low hygroscopic property, and ease of handling. In particular, it is preferable that molybdenum trioxide be used.

As the organic compound used in the mixed film, any of a variety of compounds such as aromatic amine compounds, carbazole derivatives, aromatic hydrocarbons, or high molecular compounds (such as oligomers, dendrimers, or polymers) can be used. It is to be noted that, as the organic compound used in the mixed film, a substance having a hole mobility (a hole-transporting material) of greater than or equal to $10^{-6}$ cm$^2$/Vs is preferably used. However, any substance other than the above substances may also be used as long as it is a substance in which the hole-transporting property is higher than the electron-transporting property. The organic compounds that can be used for the mixed film are specifically given below.

Examples of the aromatic amine compounds that can be used in the mixed film include N,N'-bis(4-methylphenyl)(p-tolyl)-N,N'-diphenyl-p-phenylenediamine (DTDPPA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), and the like.

Examples of the carbazole derivatives that can be used in the mixed film include 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphtyl)-N-(9-phenylcarbazol-3-yl)amino]-9-phenylcarbazole (PCzPCN1), and the like.

Moreover, examples of the carbazole derivatives that can be used in the mixed film also include 4,4'-di(N-carbazolyl)biphenyl (CBP), 1,3,5-tris[4-(N-carbazolyl)phenyl]benzene (TCPB), 9-[4-(10-phenyl-9-anthryl)phenyl]-9H-carbazole (CzPA), 1,4-bis[4-(N-carbazolyl)phenyl]-2,3,5,6-tetraphenylbenzene, and the like.

Examples of the aromatic hydrocarbons that can be used in the mixed film include 2-tert-butyl-9,10-di(2-naphthyl)anthracene (t-BuDNA), 2-tert-butyl-9,10-di(1-naphthyl)anthracene, 9,10-bis(3,5-diphenylphenyl)anthracene (DPPA), 2-tert-butyl-9,10-bis(4-phenylphenyl)anthracene (t-BuDBA), 9,10-di(2-naphthyl)anthracene (DNA), 9,10-diphenylanthracene (DPAnth), 2-tert-butylanthracene (t-BuAnth), 9,10-bis(4-methyl-1-naphthyl)anthracene (DMNA), 9,10-bis[2-(1-naphthyl)phenyl]-2-tert-butylanthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Besides these compounds, pentacene, coronene, or the like can also be used. In particular, use of an aromatic hydrocarbon which has a mobility of greater than or equal to $1 \times 10^{-6}$ cm$^2$/Vs and has 14 to 42 carbon atoms is more preferable.

It is to be noted that the aromatic hydrocarbons which can be used in the mixed film may have a vinyl skeleton. Examples of the aromatic hydrocarbons having a vinyl skeleton include 4,4'-bis(2,2-diphenylvinyl)biphenyl (DPVBi), 9,10-bis[4-(2,2-diphenylvinyl)phenyl]anthracene (DPVPA), and the like.

Fluorine or chlorine is suitable for use as the halogen atom. However, there is no limitation to the substances described here, and any other substance may be used.

Each of the first conductive layer 102 and the second conductive layer 103 may be formed using an element selected from Ta, W, Ti, Mo, Al, Cu, Ag, Au, In, and Zn; a single layer of an alloy material or a compound material containing an element given above as its main component; or a stacked layer thereof. A semiconductor film typified by a polycrystalline silicon film that is doped with an impurity element such as phosphorus may be used.

Material and formation steps of the first conductive layer 102 and the second conductive layer 103 may be different from each other. In order to reduce the number of manufacturing steps, the first conductive layer 102 and the second conductive layer 103 are preferably formed using the same material. In addition, when the first conductive layer 102 and the second conductive layer 103 are formed using the same material, the alignment can be performed with high precision.

Further, each of the first conductive layer 102 and the second conductive layer 103 generates heat by application of a voltage. At that time, if the surfaces of the first conductive layer 102 and the second conductive layer 103 are exposed, they can be oxidized and wiring resistance can be increased. Accordingly, a protective film is preferably provided to cover the first conductive layer 102 and the second conductive layer 103. However, the protective film is not necessarily provided when a material having a certain degree of conductivity, such as Ti or Zn is used as the material of each of the first conductive layer 102 and the second conductive layer 103.

Although the shape of a top surface of each of the first conductive layer 102 and the second conductive layer 103 is, but is not particularly limited to, a rectangular in FIG. 1A, the top surface may be a folded shape or a shape with a sharp projection. Further, in one memory element, a distance between the first conductive layer 102 and the second conductive layer 103 is not necessary to be uniform. Either or both the conductive layers may have a top surface that makes the distance between the first conductive layer 102 and the second conductive layer 103 partially short. In this case, the electrode distance "d" indicates the shortest distance. Since electric field is concentrated in the portion where the distance is partially short, writing data to the memory element can be performed with a lower writing voltage value.

In the memory element shown in FIGS. 1A and 1B, a voltage is applied between the pair of electrodes that are provided with the electrode distance "d" therebetween, and thus the mixed film is separated from the substrate to significantly increase the resistance value between the electrodes, whereby writing can be performed. If a voltage is not applied to the memory element, the conductivity can be kept high because of the existence of the mixed film between the pair of electrodes. In such a manner, two values can be stored to the memory element by a drastic change in the electric resistance value of the memory element depending on whether a voltage is applied or not.

Further, the memory element to which data is once written by application of a voltage between the pair of electrodes does not have an electric resistance value which is a value before application of a voltage. The memory element is nonvolatile.

Embodiment Mode 2

In this embodiment mode, a memory device including a passive-matrix memory element is described. The passive-matrix memory element is provided in the vicinity of an intersection of a bit line and a word line. FIG. 2B is a top view, and FIG. 2A is a cross-sectional view taken along a line B-B' of FIG. 2B.

Figure 2A:
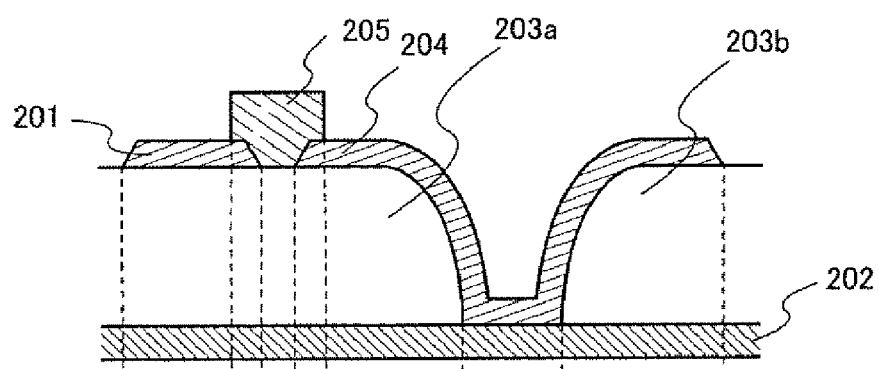
FIG. 2A is a cross-sectional view of a memory device of the present invention.
Figure 2B:
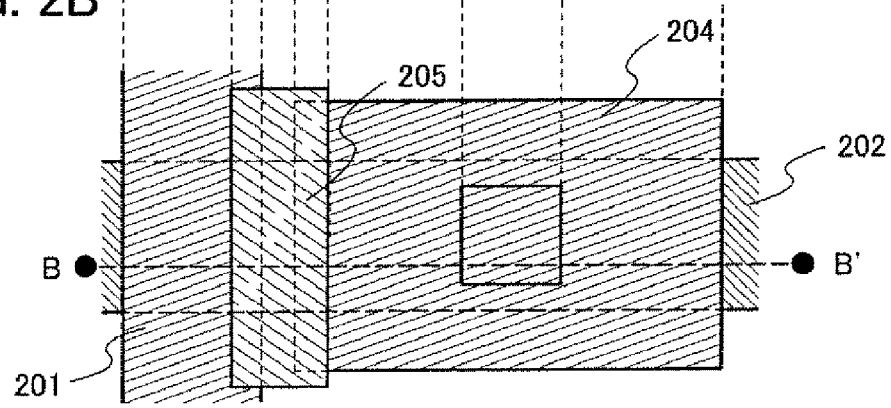
FIG. 2B is a top view thereof.

In FIG. 2A, a word line 202 is provided over a substrate that has an insulating surface, and first insulating layers 203a and 203b are provided above the word line 202. The first insulating layers 203a and 203b each have a thickness of 0.8 to 1.5 μm, which is perpendicular to the substrate surface. As the substrate that has an insulating surface, a glass substrate, a quartz substrate, or a plastic substrate is used. As another substrate that can be used, a semiconductor substrate, an SOI substrate, a ceramic substrate, a metal substrate that has an insulating film on its surface, or the like can be used.

The first insulating layers 203a and 203b are formed using the same material, in which an opening (a contact hole) reaching the word line 202 is provided. A word line electrode 204 is provided to cover the opening. The word line electrode 204 which is electrically connected to the word line 202 through the opening is provided over the first insulating layers 203a and 203b. In FIG. 2A, the word line electrode 204 and a bit line 201 are provided over the same plane, that is, over the first insulating layer 203a.

The word line 202 is a control signal line for selecting one row from a memory cell array. The memory cell array includes a plurality of memory cells that are arranged in matrix. Each memory element is arranged in the vicinity of the intersection of the word line 202 and the bit line 201, and writing and reading data can be performed by application of a voltage of the word line corresponding to an address to which reading and writing is performed.

The bit line 201 is a signal line for taking out data from the memory cell array. The memory cell that is connected to the word line 202 to which a voltage is applied performs reading data by outputting the data stored to the memory element to the bit line 201.

Further, mixed films 205 are provided between the word line electrode 204 and the bit line 201. The mixed films 205 are separately formed for each memory element arranged in the vicinity of the intersection of the word line 202 and the bit line 201.

A side surface of the word line electrode 204 and a side surface of the bit line 201 each have a tapered shape. An electrode distance "d" is a distance between lower ends of the side surfaces that face each other.

As shown in FIG. 2A, the mixed film 205 is in contact with one side surface (the side surface having a tapered shape) of the word line electrode 204. In addition, the mixed film 205 is also in contact with the side surface of the bit line 201, which faces the side surface of the word line electrode 204 which is in contact with the mixed film 205.

In order to reduce the number of steps, the word line electrode 204 and the bit line 201 are preferably fanned in the same step. In order to precisely control the distance "d" between the word line electrode 204 and the bit line 201, the same photomask is preferably used to pattern the word line electrode 204 and the bit line 201. Reduction in the distance "d" between the word line electrode 204 and the bit line 201 makes it possible to write data at a low voltage. That is, it possible to write data with low power consumption.

The word line 202, the bit line 201, and the word line electrode 204 are each formed by an evaporation method, a sputtering method, a CVD method, a printing method, an electrolytic plating method, a nonelectrolytic plating method, a droplet discharge method, or the like.

Since the mixed film 205 includes an organic compound, in the process, it is useful that the bit line 201 and the word line electrode 204 are formed in advance of the formation of the mixed film 205. Since the bit line 201 and the word line electrode 204 are formed before the mixed film 205 is formed, there are advantages that a method for forming a wiring that is to be used, particularly the deposition temperature, is not limited, and any of a variety of methods can be used.

Further, materials of the word line 202, the bit line 201, and the word line electrode 204 may be different from each other. A method for forming each of the wiring of the word line 202, the bit line 201, and the word line electrode 204 may also be different from each other.

The bit line 201 and the word line electrode 204 each of which has a side surface with a tapered shape can be formed by adjusting etching conditions in patterning as appropriate. The tapered shape of each of the bit line 201 and the word line electrode 204 is the same when the bit line 201 and the word line electrode 204 are formed in the same step. The tapered shape means that a cross section of the side surface of the electrode inclines. Each side surface of the bit line 201 and the word line electrode 204 preferably has an angle of inclination of greater than or equal to 10° and less than 85°, more preferably, greater than or equal to 60° and less than or equal to 80° to the substrate surface.

Although FIG. 2A shows an example in which the bit line 201 is provided above the word line 202, there is no particular limitation on the formation order, and the word line may be disposed above the bit line. When the word line is disposed above the bit line, a bit line electrode that is electrically connected to the bit line through the opening in the first insulating layers is formed, and the mixed film is disposed between the bit line electrode and the word line.

As described above, the passive-matrix memory element is formed by the arrangement of the memory element in the vicinity of the intersection of the bit line and the word line; accordingly, an area that is occupied by the memory element can be reduced.

This embodiment mode can be freely combined with Embodiment Mode 1.

Embodiment Mode 3

Figure 3A:
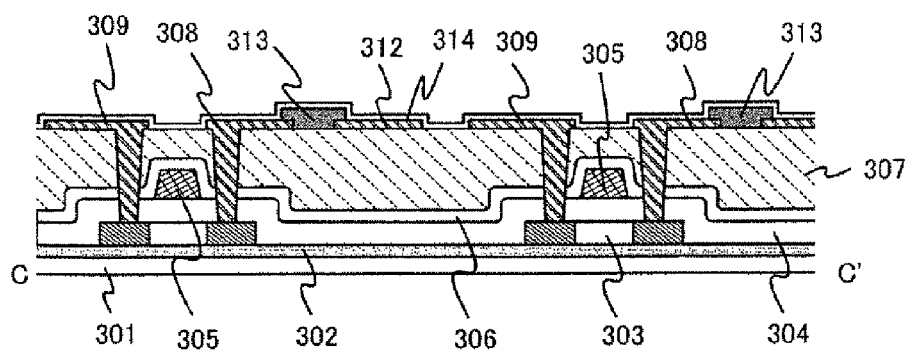
FIG. 3A is a cross-sectional view of a memory device of the present invention.
Figure 3B:
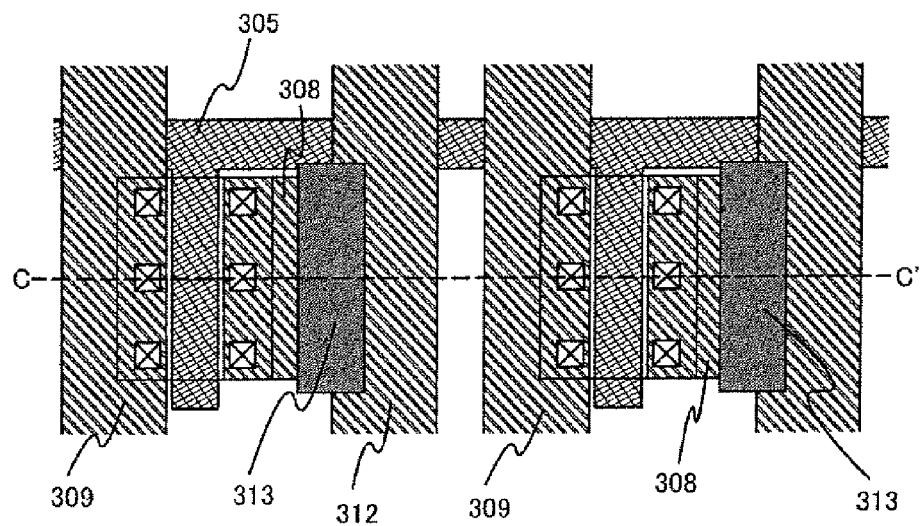
FIG. 3B is a top view thereof.

In this embodiment mode, an example of an active-matrix memory device is described. FIG. 3B is a top view. FIG. 3A is a cross-sectional view taken along a line C-C' of FIG. 3B.

In FIG. 3A, a first insulating layer 302 is provided over a substrate 301 that has an insulating surface, and a semiconductor layer 303 is provided over the first insulating layer 302. A second insulating layer 304 is provided over the first insulating layer 302 and the semiconductor layer 303, and a word line (a gate line) 305 is provided over the second insulating layer 304. A third insulating layer 306 is provided over the word line (the gate line) 305, and a fourth insulating layer 307 is provided over the third insulating layer 306. A bit line 309, a first electrode 308, and a common electrode 312 are provided over the fourth insulating layer 307. Each of the bit line 309, the first electrode 308, and the common electrode 312 is formed using the same material. Six openings (contact holes) in total, which are pairs of right and left and reach the semiconductor layer 303, are provided in the second insulating layer 304, the third insulating layer 306, and the fourth insulating layer 307. The bit line 309 and the first electrode 308 are provided so as to cover the openings. The bit line 309, the first electrode 308, and the common electrode 312 are provided over the same layer, that is, over the fourth insulating layer 307.

The semiconductor layer 303, the word line (gate line) 305, the first electrode 308, and the bit line 309 are included in a transistor.

In FIG. 3A, a mixed film 313 is in contact with side surfaces of the first electrode 308 and the common electrode 312 and a part of top surfaces (an upper end portion) thereof. The width of the mixed film 313 is larger than at least an electrode distance $D_x$.

Further, in the memory element shown in FIG. 3A, a protective layer 314 may be provided so as to cover the bit line 309, the first electrode 308, the common electrode 312, and the mixed film 313.

In this embodiment mode, the active matrix memory device is formed, and thus the memory elements can be integrated. Further, low power consumption can be achieved by reduction in the electrode distance $D_x$.

This embodiment mode can be freely combined with Embodiment Mode 1 or Embodiment Mode 2.

Embodiment 1

In this embodiment, a structure of the passive matrix memory device described in Embodiment Mode 2 and a method for writing data therein are described.

Figure 4A:
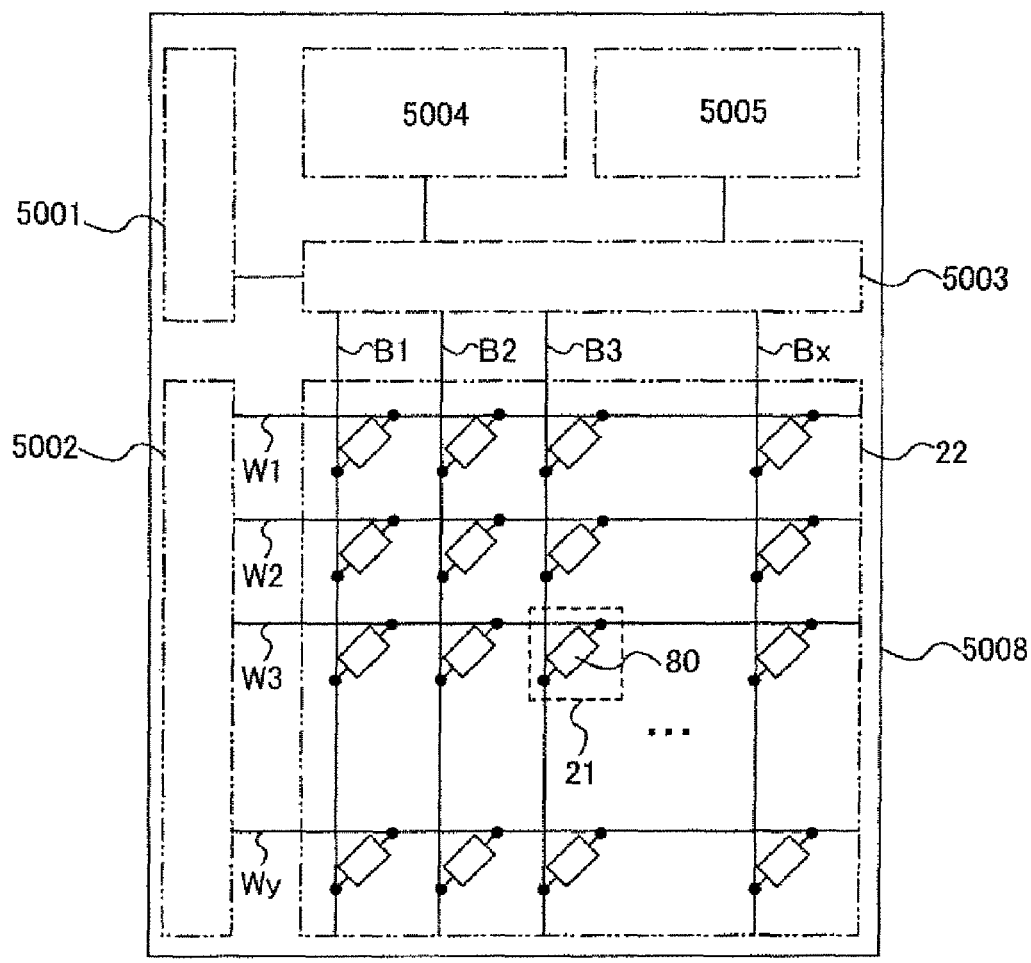
FIG. 4A is a diagram of a memory cell of the present invention.

In FIG. 4A, a word line is Wn ($1 \leq n \leq y$) and a bit line is Bm ($1 \leq m \leq x$).

FIG. 4A shows a structure of a memory device of the present invention. A memory device 5008 of the present invention has a column decoder 5001, a row decoder 5002, a reading circuit 5004, a writing circuit 5005, a selector 5003, and a memory cell array 22. The memory cell array 22 includes a plurality of memory cells 21.

Each memory cell 21 has a memory element 80.

In the present invention, as described in Embodiment Mode 2, a bit line (a first conductive layer) and a word line electrode (a second conductive layer) that is connected to a word line are formed over the same plane. The memory element 80 has a word line electrode, a bit line, and a mixed film between the word line electrode and the bit line.

It is to be noted that a structure of the memory device 5008 described in this embodiment is just an example. An appropriate circuit structure may be used depending on the type of a reading method or a writing method.

The column decoder 5001 receives an address signal specifying a column of the memory cell array and gives a signal to the selector 5003. The selector 5003 receives the signal from the column decoder 5001, selects a bit line of the specified column, and connects the selected bit line to writing circuit 5005 or a reading circuit 5004. The row decoder 5002 receives an address signal specifying a row of the memory cell array and supplies a predetermined electric potential to a word line of the specified row. Through the above operation, one memory cell 21 in response to the address signal is selected. The reading circuit 5004 reads data of the selected memory cell and amplifies the data to output the amplified data. The writing circuit 5005 generates a voltage that is necessary for writing and applies the voltage to a memory element of the selected memory cell to perform data writing.

Figure 4B:
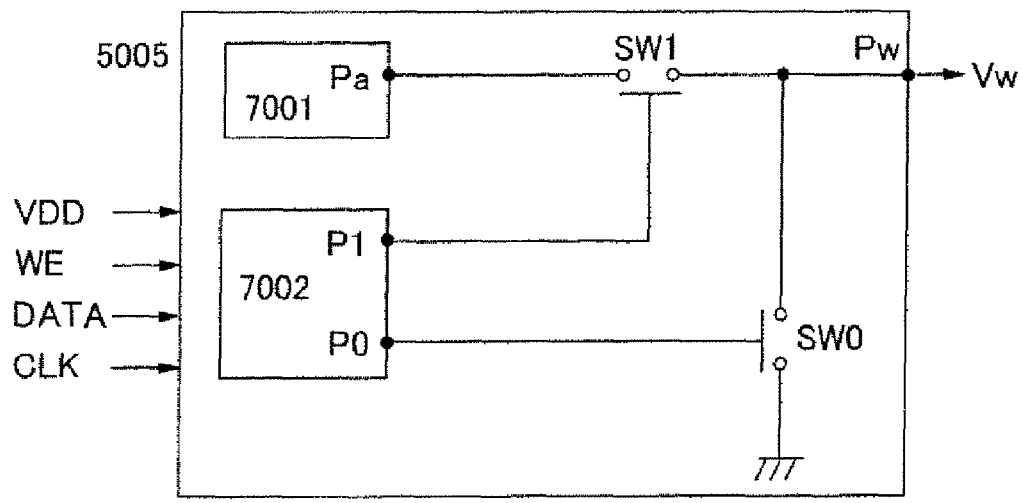
FIG. 4B is a diagram of a writing circuit included therein.

FIG. 4B shows a structure of the writing circuit 5005 included in the memory device of the present invention. The writing circuit 5005 includes a voltage generating circuit 7001, a timing control circuit 7002, switches SW0 and SW1, and an output terminal Pw. In addition, a writing control signal (denoted by WE), a data signal (denoted by DATA), a clock signal (denoted by CLK), and the like are inputted into the writing circuit 5005. The voltage generating circuit 7001 is formed of a boosting circuit or the like and generates a voltage V1 that is necessary for writing data, which is outputted from an output terminal Pa. The timing control circuit 7002 generates signals S0 and S1 for controlling the switches SW0 and SW1, respectively, and outputs the signals S0 and S1 from output terminals P0 and P1, respectively. The switch SW0 controls a connection with the ground voltage, and the SW1 controls a connection with the output terminal Pa of the voltage generating circuit 7001. An output voltage Vw from the output terminal Pw of the writing circuit can be switched by these switches.

Next, a write operation is described, where "0" refers to an initial state in which conductivity of the memory element is not changed, and "1" refers to a state in which the resistance between the electrodes, which changes the conductivity of the memory element, is high. First, an input signal WE becomes a high level, the column decoder 5001, which has received an address signal specifying a column, gives a signal to the selector 5003, and the selector 5003 connects the bit line of the specified column to the output terminal Pw of the writing circuit. The bit line which is not specified is in a non-connection (referred to as floating) state. Similarly, the row decoder 5002, which has received an address signal specifying a row, applies a voltage V2 to the word line of the specified row and the word line that is not specified is placed in a floating state. Through the above operation, one memory element 80 in response to the address signal is selected.

At the same time, when an input signal DATA receives a high level signal, the timing control circuit 7002 generates signals S0 (=Low level) and S1 (=High level), and outputs the signals from the output terminals P0 and P1, respectively. By the above signals, the switch SW0 is turned off, and the switch SW1 is turned on, and the writing circuit 5005 outputs the voltage V1 as the output voltage Vw from the output terminal Pw.

In the selected memory element, through the above operation, the voltage V1 is applied to the first conductive layer, and the voltage V2 is applied to the second conductive film. Then, the mixed film is separated. As a result, conductivity of the memory element is changed and placed in a high resistance state, and "1" is written. The voltage V1 and V2 are selected from the range of values of the voltage, where the conductivity of the memory device can be changed by application of the voltage V1-V2 to the memory device.

When the input signal WE becomes a low level, all the bit lines and all the word lines are each placed in a floating state. By the above operation, writing is stopped.

Next, writing of "0" is described. When writing of "0" is performed, conductivity of the memory element is not changed, and a voltage is not applied to the memory element. In other words, writing of "0" can be achieved with the initial state retained. First, in a similar manner to that of writing of "1", when the input signal WE becomes a high level (a high voltage which enables writing), the column decoder 5001 which has received an address signal specifying a column gives a signal to the selector 5003 of the specified column, and the selector 5003 connects the bit line of the specified column to the output terminal Pw of the writing circuit. At this time, the bit line which is not specified is placed in a floating state. Similarly, the row decoder 5002 which has received an address signal specifying a row applies V2 to the word line of the specified row and the word line which is not specified is placed in a floating state. Through the above operation, one memory element 80 in response to the address signal is selected.

At the same time, an input signal DATA receives a low level signal, the timing control circuit 7002 generates a control signal S0 at a high level and a control signal S1 at a low level and outputs the control signals S0 and S1 from the output terminals P0 and P1, respectively. By the control signals, the switch SW0 comes to be on, and the switch SW1 comes to be off; accordingly, 0V is outputted as the output voltage Vw from the output terminal Pw.

In the selected memory element, through the above operation, 0V is applied to the bit line, and V2 is applied to the word line. The voltage V2 is selected from the range of values of the voltage, where the conductivity of the memory device is not changed by application of the voltage V2 to the memory device. The conductivity of the memory element is not changed; thus, an initial state "0" is retained.

When the input signal WE becomes a low level, all the bit lines and all the word lines are each placed in a floating state.

In such a manner, writing of "1" or "0" can be performed.

Next, reading of data is described.

In FIG. 5, reference numeral 14 denotes a word line, and reference numeral 16 denotes a bit line.

In a similar manner to that of the writing of data, one memory element 18a in response to the address signal is selected. FIG. 5 shows one selected cell 18a and non-selected cells 18b. A voltage Vs is applied to the word line 14 connected to the selected cell 18a, and the other word lines 14, which are not selected, are placed in a floating state. In addition, a reading circuit is connected to a bit line 16 connected to the selected cell 18a, and the other bit lines 16, which are not selected, are placed in a floating state. The reading circuit determines whether a state of the memory is "1" or "0" in accordance with the current which flows through the selected cell 18a.

This embodiment can be freely combined with Embodiment Mode 1, Embodiment Mode 2, or Embodiment Mode 3.

Embodiment 2

Figure 6A:
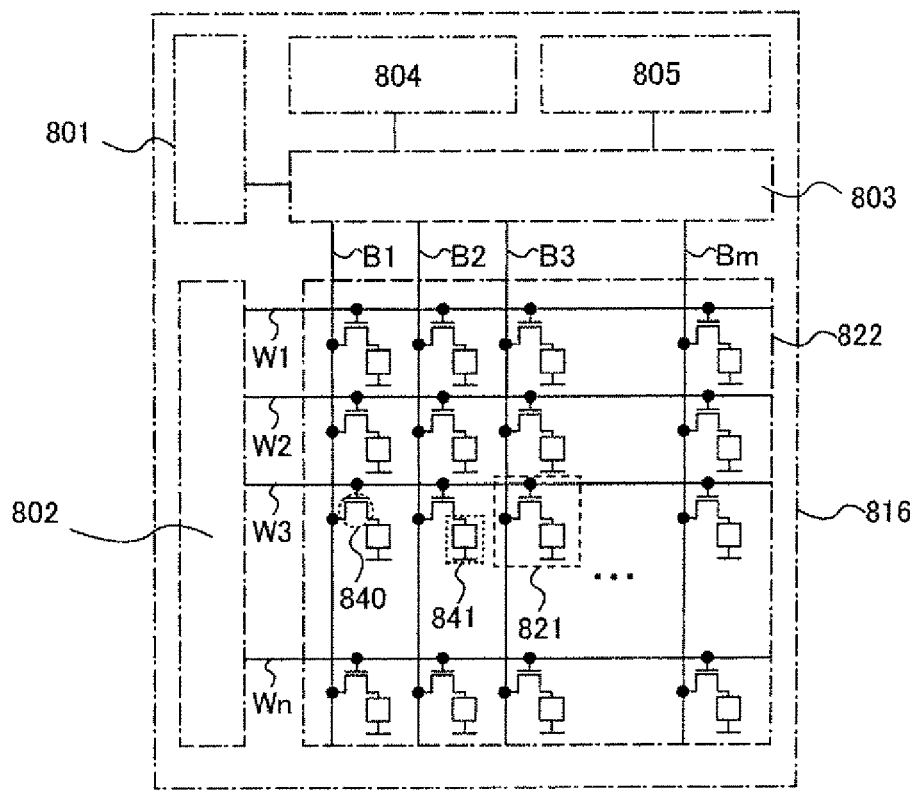
FIGS. 6A and 6B are diagrams of equivalent circuits of a semiconductor device of the present invention.
Figure 6B:
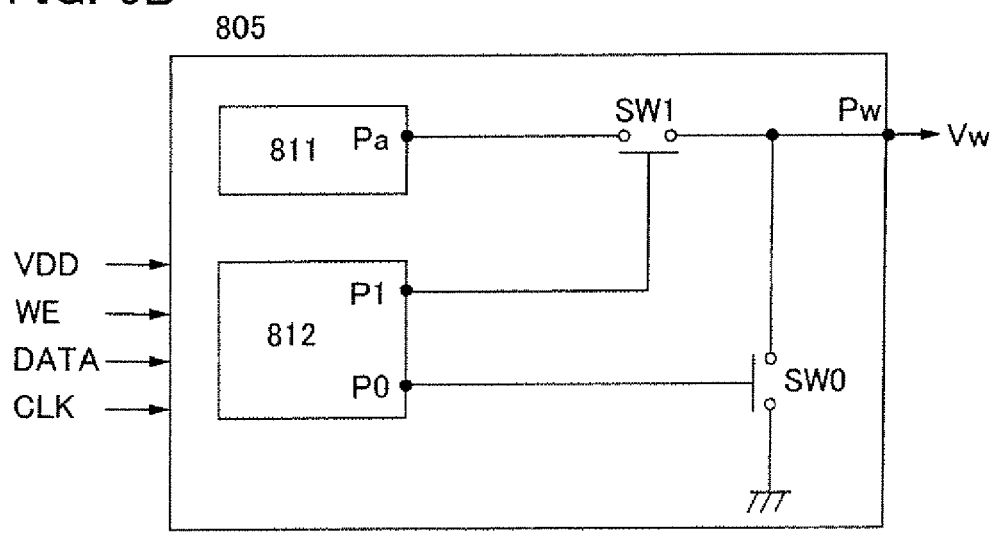

In this embodiment, a structure of the active matrix memory device described in Embodiment Mode 3 and a method for writing data therein are described using equivalent circuits shown in FIGS. 6A and 6B.

In an example of a structure of a memory device described in this embodiment, a column decoder 801, a row decoder 802, a reading circuit 804, a writing circuit 805, a selector 803, and a memory cell array 822 are included. The memory cell array 822 includes bit lines Bm ($1 \leq m \leq x$), word lines Wn ($1 \leq n \leq y$), and x×y memory cells 821 at intersections of the bit lines and the word lines.

The memory cell 821 has a first wiring that forms a bit line $B_x$ ($1 \leq x \leq m$), a second wiring that forms a word line $W_y$ ($1 \leq y \leq n$), a transistor 840, and a memory element 841. The memory element 841 has a structure in which a mixed film is interposed between a pair of conductive layers that are arranged in parallel, as described in Embodiment Mode 3.

It is to be noted that a structure of the memory device 816 described in this embodiment is just an example. An appropriate circuit structure may be used depending on the type of a reading method or a writing method.

The column decoder 801 receives an address signal specifying a column of the memory cell array and gives a signal to the selector 803. The selector 803 receives the signal from the column decoder 801 and selects a bit line of the specified column. The row decoder 802 receives an address signal specifying a row of the memory cell array and selects a word line of the specified row. Through the above operation, one memory cell 821 in response to the address signal is selected.

The memory cell 821 includes a transistor 840 and a memory element 841. In FIG. 6A, the memory cell 821 is denoted by a rectangle. A word line is connected to a gate electrode of the transistor 840, a bit line is connected to one high concentration impurity region of the transistor, and a first electrode of the memory element 841 is connected to the other high concentration impurity region of the transistor. Second electrodes of all the memory elements in the memory cell array are electrically connected to each other, and a common voltage is applied to the second electrodes when the memory device operates, in other words, at the time of reading or writing. The reading circuit 804 reads data stored to a memory element and outputs the data by determining a state of the memory element of the selected memory cell. The writing circuit 805 generates a voltage that is necessary for writing data and applies the voltage to a memory element of the selected memory cell to perform data writing.

FIG. 6B shows a structure of the writing circuit 805 included in the memory device of the present invention. The writing circuit 805 includes a voltage generating circuit 811, a timing control circuit 812, switches SW0 and SW1, and an output terminal Pw. In addition, a writing control signal (denoted by WE), a data signal (denoted by DATA), a clock signal (denoted by CLK), and the like are inputted into the writing circuit 805. The voltage generating circuit 811 is formed of a boosting circuit or the like and generates the voltage V1 that is necessary for writing data, which is outputted from an output terminal Pa. The timing control circuit 812 generates signals S0 and S1 controlling the switches SW0 and SW1, respectively, and outputs the signals S0 and S1 from output terminals P0 and P1, respectively. The switch SW0 controls a connection with the ground, and the switch SW1 controls a connection with the output Pa of the voltage generating circuit 811. The output voltage Vw from the output terminal Pw of the writing circuit can be switched based on whether each of the switches SW0 and SW1 is on or off.

Next, a write operation is described, where "0" refers to an initial state in which conductivity of the memory element is not changed, and "1" refers to a state in which resistance changing the conductivity of the memory element is high. First, an input signal WE becomes a high level, the column decoder 801, which has received an address signal specifying a column, gives a signal to the selector 803, and the selector 803 electrically connects the bit line of the specified column to the output terminal Pw of the writing circuit. The bit line which is not specified is in a non-connection (referred to as floating) state. The output voltage Vw of the writing circuit is applied to the bit line of the specified column. Similarly, the row decoder 802, which has received an address signal specifying a row, applies the voltage V2 to the word line of the specified row and 0V to the word line that is not specified. Through the above operation, one memory element 841 in response to the address signal is selected. The voltage V2 is selected from the range of value of the voltage, where the transistor 840 can be placed in an on state by application of the voltage V2 to the gate electrode.

At the same time, by receiving a data signal (DATA) at a high level, the voltage generating circuit 811 can generate the voltage V1 and output the voltage V1 from the output Pa. The timing control circuit 812 can generate signals S0 at a low level and S1 at a high level controlling the switches SW0 and SW1, respectively, based on input signals WE, DATA, CLK, power supply potential (VDD), and the like, and output the signals S0 and S1 from the outputs P0 and P1, respectively. By the above signals S0 and S1, the switch SW0 comes to be off, and the switch SW1 comes to be on. The writing circuit 805 can output the voltage V1 as the output voltage Vw from the output terminal Pw.

In the selected memory element, through the above operation, the voltage V2 is applied to the word line, the voltage V1 is applied to the bit line, and 0V is applied to the second electrode. Therefore, the voltage V1 is applied to the memory element. Then, an impurity region of the thin film transistor is made conductive, and the voltage V1 of the bit line is applied to the memory element. As a result, conductivity of the memory element is changed and placed in a high resistance state, and "1" is written to the memory element.

When the input signal WE becomes a low level, voltages of all the word lines become 0V, and all the bit lines are placed in a floating state. At the same time, the timing control circuit 812 generates signals S0 and S1 each at a low level, which are outputted from the output terminals P0 and P1, respectively. The output terminal Pw is placed in a floating state. By the above operation, writing of "1" is terminated.

Next, writing of "0" is described. When writing of "0" is performed, conductivity of the memory element is not changed, and a voltage is not applied to the memory element. In other words, writing of "0" can be achieved with the initial state retained. First, similarly to writing of "1", when the input signal WE becomes a high level, the column decoder 801 which has received an address signal specifying a column gives a signal to the selector 803 of the specified column, and the selector 803 connects the bit line of the specified column to the output terminal Pw of the writing circuit 805. At this time, the bit line which is not specified is placed in a floating state. Similarly, the row decoder 802 which has received an address signal specifying a row applies the voltage V2 to the word line of the specified row and 0V to the word line which is not specified. Through the above operation, one memory element 841 in response to the address signal is selected.

At the same time, by receiving the input signal DATA at a low level, the timing control circuit 812 generates control signals S0 at a high level and S1 at a low level and outputs the control signals S0 and S1 from the outputs P0 and P1, respectively. By the control signals S0 and S1, the switch SW0 comes to be on and the switch SW1 comes to be off, and 0V is outputted as the output voltage Vw from the output terminal Pw.

In the selected memory element, through the above operation, V2 is applied to the word line, and the transistor is placed in an on state. However, 0V is applied to the first electrode connected to the bit line and the second electrode. As a result, a voltage is not applied to the memory element, and conductivity of the memory element is not changed; thus, an initial state "0" is retained.

When the input signal WE becomes a low level, all the word lines becomes 0V, and all the bit lines are placed in a floating state. At the same time, the timing control circuit 812 generates signals S0 and S1 at a low level, which are outputted from the output terminals P0 and P1, respectively, and the output terminal Pw is placed in a floating state. By the above operation, writing of "0" is terminated.

As described above, writing of "1" or "0" can be performed.

In addition, the memory cell array 822 includes a plurality of transistors 840 each of which functions as a switching element and a plurality of memory elements 841 each of which is connected to the transistor 840 over a substrate that has an insulating surface.

This embodiment can be freely combined with Embodiment Mode 2, Embodiment Mode 3, or Embodiment Mode 4.

Embodiment 3

Figure 7:
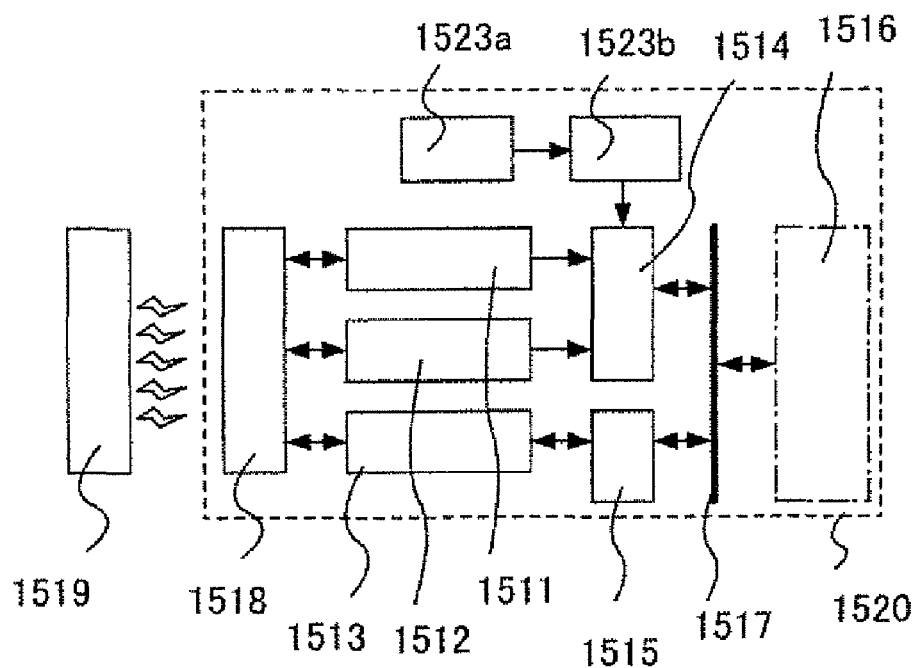
FIG. 7 is a diagram illustrating an exemplary structure of a semiconductor device of the present invention.

A structure of a semiconductor device is described with reference to FIG. 7. As shown in FIG. 7, a semiconductor device 1520 of the present invention has a function of non-contact communication of data and includes a power supply circuit 1511, a clock generating circuit 1512, a data demodulation/modulation circuit 1513, a control circuit 1514 controlling other circuits, an interface circuit 1515, a memory circuit 1516, a data bus 1517, an antenna (an antenna coil) 1518, a sensor 1523a, and a sensor circuit 1523b.

The power supply circuit 1511 generates a variety of kinds of power supply voltage that is to be supplied to each circuit inside the semiconductor device 1520, based on an AC signal inputted from the antenna 1518. The clock generating circuit 1512 generates a variety of kinds of clock signals that are to be supplied to each circuit inside the semiconductor device 1520, based on the AC signal inputted from the antenna 1518. The data demodulation/modulation circuit 1513 has a function of demodulating/modulating data for communication with a reader/writer 1519. The control circuit 1514 has a function of controlling the memory circuit 1516. The antenna 1518 has a function of transmitting/receiving an electric wave. The reader/writer 1519 communicates with and controls the semiconductor device and controls the processing of data thereof. It is to be noted that the structure of the semiconductor device is not limited to the above structure, and for example, other elements such as a limiter circuit of power supply voltage and hardware dedicated to encryption processing may be added to the semiconductor device.

The memory circuit 1516 has a memory element in which a mixed film is interposed between a pair of conductive layers, which is described as the memory element in Embodiment Modes 1 to 3. In this memory element, change in electric resistance is generated by electrical action from an external side. It is to be noted that the memory circuit 1516 may include only the memory element in which the mixed film is interposed between a pair of conductive layers or include a memory circuit that has any other structure. The memory circuit having any other structure corresponds to, for example, one or more selected from a DRAM, an SRAM, a FeRAM, a mask ROM, a PROM, an EPROM, an EEPROM, or a flash memory.

The sensor 1523a is formed using a semiconductor element such as a resistor element, a capacitive coupling element, an inductive coupling element, a photovoltaic element, a photoelectric conversion element, a thermal electromotive force element, a transistor, a thermistor, or a diode. The sensor circuit 1523b detects a change in impedance, reactance, inductance, voltage, or current and performs analog/digital conversion (A/D conversion) to output a signal to the control circuit 1514.

This embodiment can be freely combined with any one of Embodiment Modes 1 to 3, Embodiment 1 or Embodiment 2.

Embodiment 4

Figure 9A:
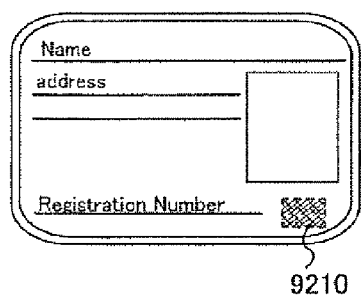
FIGS. 9A to 9F are diagrams of electronic devices each of which includes a semiconductor device of the present invention.
Figure 9B:
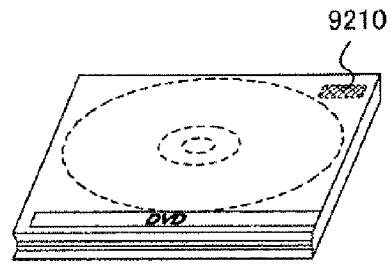
Figure 9C:
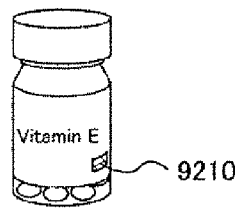
Figure 9D:
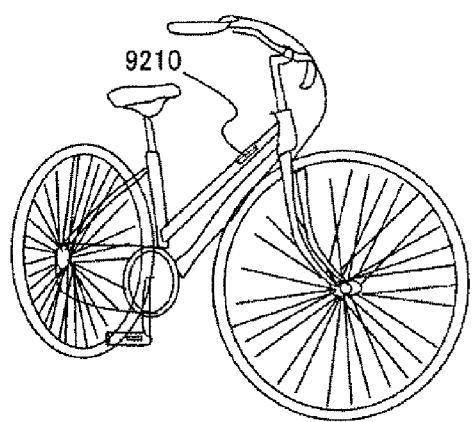
Figure 9E:
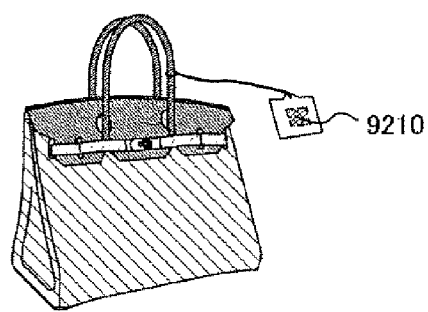
Figure 9F:
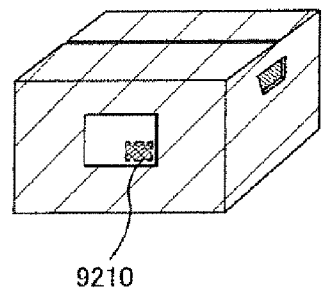

In accordance with the present invention, a semiconductor device functioning as a wireless chip can be formed. Wireless chips have a variety of uses and can be mounted in objects such as bills, coins, securities, bearer bonds, and certificates (e.g., driver's licenses and resident cards, see FIG. 9A); recording media (e.g., DVD software and video tapes, see FIG. 9B); containers for wrapping objects (e.g., wrapping paper and bottles, see FIG. 9C); vehicles (e.g., bicycles, see FIG. 9D); personal belongings (e.g., bags and glasses), food, plants, animals, human bodies, clothes, livingware, and electronic devices; or tags for baggage or packages of products such as electronic devices (see FIGS. 9E and 9F). The electronic devices refer to liquid crystal display devices, EL display devices, television units (also simply referred to as TVs, TV receivers, or television receivers), cellular phones, or the like.

A semiconductor device 9210 of the present invention is fixed to an object by being mounted on a printed board, being attached to a surface, or being incorporated into the object. For example, the semiconductor device is fixed to each object by being incorporated in paper of a book, being an organic resin of a package, or the like. In the semiconductor device 9210 of the present invention, reduction in size, thickness, and weight are achieved, and accordingly, the design of the object itself is not damaged even after the semiconductor device is fixed to the object. Furthermore, a certification function can be given when the semiconductor device 9210 of the present invention is provided in bills, coins, securities, bearer bonds, certificates, or the like. Forgery thereof can be prevented with the use of the certification function. Further, a system such as an inspection system can be made more efficient when the semiconductor device 9210 of the present invention is provided in containers for wrapping objects, recording media, personal belongings, food, clothes, livingware, electronic devices, or the like.

Figure 8:
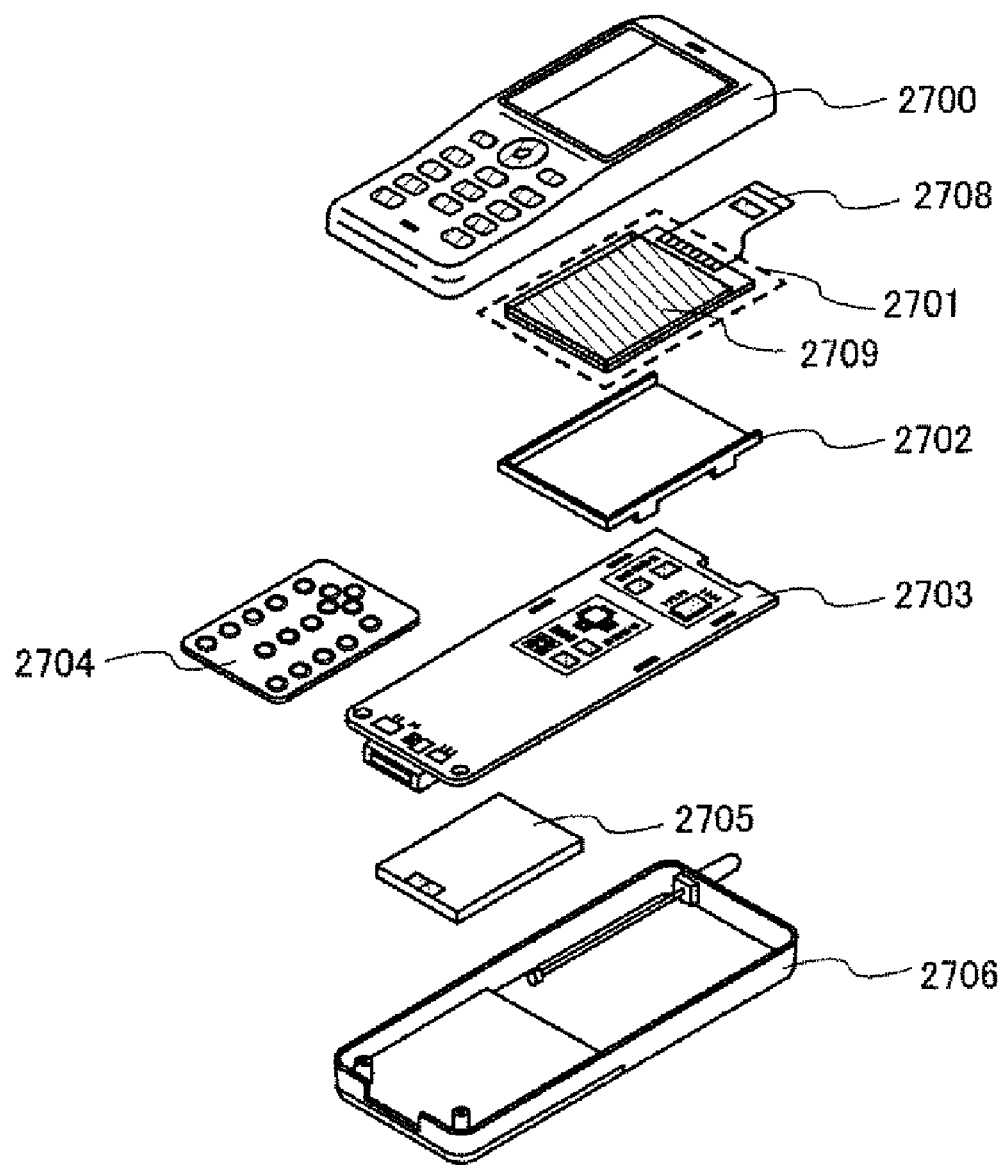
FIG. 8 is a diagram illustrating a usage of a semiconductor device of the present invention.

Next, an example of an electronic device mounted with the semiconductor device of the present invention is described with reference to the drawing. The electronic device illustrated here is a cellular phone, which includes chassises 2700 and 2706, a panel 2701, a housing 2702, a printed wiring board 2703, operation buttons 2704, and a battery 2705 (see FIG. 8). The panel 2701 is incorporated in the housing 2702 so as to be detachable, and the housing 2702 is mounted on the printed wiring board 2703. The shape or size of the housing 2702 is changed as appropriate depending on an electronic device in which the panel 2701 is incorporated. A plurality of semiconductor devices that is packaged are mounted on the printed wiring board 2703, and the semiconductor device of the present invention can be used as one of such semiconductor devices. Each of the plurality of semiconductor devices mounted on the printed wiring board 2703 has a function of any one of a controller, a central processing unit (CPU), a memory, a power supply circuit, an audio processing circuit, a transmit/receive circuit, or the like.

The panel 2701 is fixed to the printed wiring board 2703 with a connection film 2708. The panel 2701, the housing 2702, and the printed wiring board 2703 are stored in the chassises 2700 and 2706, with the operation buttons 2704 and the battery 2705. A pixel region 2709 included in the panel 2701 is arranged so as to be seen through an aperture provided in the chassis 2700.

As described above, the semiconductor device of the present invention has effects of small size, thin shape, and lightweight. Because of these effects, a limited space inside the chassises 2700 and 2706 of the electronic device can be used efficiently.

In addition, since the semiconductor device of the present invention includes a memory element that has a simple structure in which a mixed film that is changed by external electric action is interposed between a pair of conductive layers, an electronic device that uses an inexpensive semiconductor device can be provided. Further, since the semiconductor device of the present invention can be easily highly integrated, an electronic device that uses a semiconductor device that has a large-capacity memory circuit can be provided. As the memory element included in the semiconductor device of the present invention, the memory element described in any one of Embodiment Modes 1 to 3 can be used.

Furthermore, data can be written by external electric action in the memory device included in the semiconductor device of the present invention, which is a nonvolatile memory device in which data can be written additionally. With this feature, forgery by rewriting can be prevented, and new data can be additionally written. Therefore, an electronic device that uses a semiconductor device in which a higher function and higher added-value are achieved can be provided.

It is to be noted that each of the chassises 2700 and 2706 are an example of an appearance shape of a cellular phone. The electronic device of this embodiment can be modified in a variety of ways depending on the function or application thereof.

This embodiment can be freely combined with any one of Embodiment Modes 1 to 3 and Embodiments 1 to 3.

This application is based on Japanese Patent Application serial no. 2007-096977 filed with Japan Patent Office on Apr. 3, 2007, the entire contents of which are hereby incorporated by reference.

What is claimed is:

1. A method for manufacturing a memory device comprising the steps of:
    forming a conductive film over an insulating surface;
    forming a mask over the conductive film;
    patterning the conductive film with the use of the mask to form a first conductive layer and a second conductive layer; and
    forming a mixed film between a side surface of the first conductive layer and a side surface of the second conductive layer facing the side surface of the first conductive layer,
    wherein the mixed film is a film including an inorganic compound, an organic compound, and a halogen atom, and
    wherein the halogen atom is added to the mixed film by ion implantation.

2. The method for manufacturing a memory device according to claim 1,
    wherein the inorganic compound is molybdenum oxide, and
    wherein the organic compound is a hole-transporting material.

3. The method for manufacturing a memory device according to claim 2, wherein the molybdenum oxide is molybdenum trioxide.

4. The method for manufacturing a memory device according to claim 2, wherein the hole-transporting material is an aromatic amine compound or an anthracene derivative.

5. The method for manufacturing a memory device according to claim 1, wherein the halogen atom is fluorine or chlorine.

6. A method for manufacturing a memory device comprising the steps of:
    forming a wiring over an insulating surface;
    forming an insulating film having an opening over the wiring;
    forming a conductive film over the insulating film and in the opening;
    forming a mask over the conductive film;
    patterning the conductive film with the use of the mask to form a first conductive layer and a second conductive layer; and
    forming a mixed film between a side surface of the first conductive layer and a side surface of the second conductive layer facing the side surface of the first conductive layer,
    wherein one of the first conductive layer and the second conductive layer is electrically connected to the wiring, and wherein the mixed film is a film including an inorganic compound, an organic compound, and a halogen atom.

7. The method for manufacturing a memory device according to claim 6,
wherein the inorganic compound is molybdenum oxide, and
wherein the organic compound is a hole-transporting material.

8. The method for manufacturing a memory device according to claim 7, wherein the molybdenum oxide is molybdenum trioxide.

9. The method for manufacturing a memory device according to claim 7, wherein the hole-transporting material is an aromatic amine compound or an anthracene derivative.

10. The method for manufacturing a memory device according to claim 6, wherein the halogen atom is fluorine or chlorine.

11. The method for manufacturing a memory device according to claim 6, wherein the halogen atom is added to the mixed film by ion implantation.

12. The method for manufacturing a memory device according to claim 6, wherein the wiring is a word line.

13. A method for manufacturing a memory device comprising the steps of:
forming a transistor over an insulating surface;
forming an insulating film having an opening over the transistor;
forming a conductive film over the insulating film;
forming a mask over the conductive film;
patterning the conductive film with the use of the mask to form a first conductive layer and a second conductive layer; and
forming a mixed film between a side surface of the first conductive layer and a side surface of the second conductive layer facing the side surface of the first conductive layer,
wherein one of the first conductive layer and the second conductive layer is electrically connected to a source or a drain of the transistor, and
wherein the mixed film is a film including an inorganic compound, an organic compound, and a halogen atom.

14. The method for manufacturing a memory device according to claim 13,
wherein the inorganic compound is molybdenum oxide, and
wherein the organic compound is a hole-transporting material.

15. The method for manufacturing a memory device according to claim 14, wherein the molybdenum oxide is molybdenum trioxide.

16. The method for manufacturing a memory device according to claim 14, wherein the hole-transporting material is an aromatic amine compound or an anthracene derivative.

17. The method for manufacturing a memory device according to claim 13, wherein the halogen atom is fluorine or chlorine.

18. The method for manufacturing a memory device according to claim 13, wherein the halogen atom is added to the mixed film by ion implantation.

* * * * *